United States Patent
Xue et al.

(10) Patent No.: US 9,761,613 B2
(45) Date of Patent: Sep. 12, 2017

(54) TFT ARRAY SUBSTRATE AND MANUFACTURING METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Hailin Xue, Beijing (CN); Yubo Xu, Beijing (CN); Cheng Li, Beijing (CN); Jidong Zhang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/160,893

(22) Filed: Jan. 22, 2014

(65) Prior Publication Data

US 2014/0131718 A1 May 15, 2014

Related U.S. Application Data

(63) Continuation-in-part of application No. 13/332,689, filed on Dec. 21, 2011, now abandoned.

(30) Foreign Application Priority Data

Dec. 22, 2010 (CN) .......................... 2010 1 0601389

(51) Int. Cl.
*H01L 29/04* (2006.01)
*H01L 29/10* (2006.01)
(Continued)

(52) U.S. Cl.
CPC .......... *H01L 27/124* (2013.01); *G02F 1/1345* (2013.01); *G02F 1/136286* (2013.01); *H01L 27/1255* (2013.01); *G02F 2201/121* (2013.01)

(58) Field of Classification Search
CPC ............... H01L 27/124; H01L 27/1255; G02F 1/134363; G02F 1/1345; G02F 1/136213; G02F 1/136286; G02F 2201/121
(Continued)

(56) References Cited

U.S. PATENT DOCUMENTS

2002/0097349 A1 7/2002 Park
2003/0201438 A1 10/2003 Park
(Continued)

FOREIGN PATENT DOCUMENTS

CN 1304055 A 7/2001
JP 10239699 A 9/1998
(Continued)

OTHER PUBLICATIONS

Third Chinese Office Action Issued Aug. 7, 2014; Appln. No. 201010601389.7.
(Continued)

*Primary Examiner* — Fernando L Toledo
*Assistant Examiner* — Aaron Gray
(74) *Attorney, Agent, or Firm* — Ladas & Parry LLP

(57) ABSTRACT

A thin film transistor (TFT) array substrate is disclosed and having a pixel region and a peripheral region surrounding the pixel region, and the pixel region comprises horizontal gate lines, longitudinal data lines defining pixel units with the horizontal gate lines, and storage capacitor electrode (Vcom) lines. The peripheral region comprises at least one peripheral common electrode line which is electrically connected with an integrated-circuit (IC) element. The Vcom
(Continued)

lines are connected with the peripheral common electrode line through one or more Vcom line IC terminals.

12 Claims, 7 Drawing Sheets

(51) Int. Cl.

| | | |
|---|---|---|
| *H01L 29/12* | (2006.01) | |
| *H01L 29/786* | (2006.01) | |
| *H01L 29/15* | (2006.01) | |
| *G02F 1/136* | (2006.01) | |
| *H01L 21/00* | (2006.01) | |
| *H01L 27/12* | (2006.01) | |
| *G02F 1/1362* | (2006.01) | |
| *G02F 1/1345* | (2006.01) | |

(58) Field of Classification Search
USPC ............... 257/59, 66, 71, 72, 291, E33.053; 349/42, 43, 54; 438/29, 30, 34, 38, 39
See application file for complete search history.

(56) References Cited

U.S. PATENT DOCUMENTS

| | | | |
|---|---|---|---|
| 2004/0090566 A1 | 5/2004 | Jung et al. | |
| 2004/0196228 A1 | 10/2004 | Ahn | |
| 2006/0097262 A1 | 5/2006 | Kim et al. | |
| 2009/0040166 A1* | 2/2009 | Lee et al. | 345/98 |
| 2010/0110057 A1* | 5/2010 | Lee | G02F 1/134309 345/211 |
| 2010/0110359 A1* | 5/2010 | Lee | G02F 1/1345 349/149 |
| 2010/0123868 A1 | 5/2010 | Kim et al. | |
| 2010/0225859 A1* | 9/2010 | Tsai et al. | 349/106 |
| 2014/0184964 A1* | 7/2014 | Byeon | G02F 1/134363 349/33 |

FOREIGN PATENT DOCUMENTS

| | | |
|---|---|---|
| JP | 11-352520 A | 12/1999 |
| JP | 2001-1255549 A | 9/2001 |
| JP | 2005-534974 A | 11/2005 |
| JP | 2008-250176 A | 10/2008 |
| JP | 2009-128907 A | 6/2009 |
| KR | 20010050708 A | 6/2001 |
| KR | 1020060074945 A | 7/2006 |
| KR | 20070072161 A | 7/2007 |

OTHER PUBLICATIONS

KIPO NOA dated Sep. 5, 2013; Appln. No. 10-2011-0140320.
USPTO NFOA dated Apr. 12, 2013; U.S. Appl. No. 13/332,689.
USPTO FOA dated Oct. 24, 2013; U.S. Appl. No. 13/332,689.
Second Chinese Office Action dated Apr. 15, 2014; Appln. No. 201010601389.7.
Chinese Rejection Decision dated Dec. 2, 2014; Appln. No. 201010601389.7.
Japanese Office Action Appln. No. 2011-279493; Dated Jul. 13, 2015.
Japanese Office Action dated Mar. 28, 2016; Appln. No. 2011-279493.
Third Japanese Office Action dated Nov. 14, 2016; Appln. No. 2011-279493.

* cited by examiner

TFT ARRAY SUBSTRATE AND MANUFACTURING METHOD THEREOF

BACKGROUND

Embodiments of the disclosed technology pertain to a thin film transistor (TFT) array substrate and a manufacturing method thereof.

Thin film transistor-liquid crystal displays (TFT-LCDs) employ a variable electric field applied onto a liquid crystal layer to control the orientations of liquid crystal molecules and therefore control transmittance of the liquid crystal layer to conduct display of images.

In general, a liquid crystal panel comprises a backlight module, a lower array substrate, an upper color filter substrate and a liquid crystal layer filled into the space formed by combining the two substrates together. Each pixel unit on the array substrate comprises a pixel electrode and a TFT switch element, and the application and amplitudes of the voltage on the pixel electrode are controlled respectively by the gate signals over the gate electrode, connected with a gate line, of the TFT switch element and by the data signal over the source electrode, connected with a data line, of the TFT switch element. The common electrode on the upper color filter substrate cooperates with the pixel electrodes on the lower array substrate to control the orientations of the liquid crystal molecules with the variable electric field produced therebetween. On the array substrate, storage capacitor lines (Vcom lines) that are parallel with and on the same level as the gate lines can form storage capacitors with pixel electrodes therebetween for maintaining the state of the liquid crystal molecules of the corresponding pixel units before arrival of a next driving signal.

An array substrate may be implemented in a dual-gate configuration, which can effectively reduce the amount of data line integrated-circuit (IC) terminals (i.e., connecting parts with a driving IC) and realize the benefits of lowering costs. In order to avoid a greenish defect, a panel with the dual-gate configuration typically adopts a reticulated Vcom line configuration, as shown in FIG. 1. In FIG. 1, the array substrate comprises gate lines 1, data lines 2. Vcom line IC terminals 3, Vcom lines 4 and pixel units 5. The Vcom line IC terminals 3 are the connecting parts of the Vcom lines with a driving IC. From FIG. 1, the Vcom lines 4 for all the pixel units are electrically connected in both the horizontal and the longitudinal directions to form a network configuration, and further the Vcom line IC terminals in the longitudinal direction are arranged alternatively with the data line IC terminals in the longitudinal directions.

In particular, in FIG. 1, the IC terminals from the left side to the right side comprise a Vcom line IC terminal 31, a data line IC terminal 21, a Vcom line IC terminal 32, a data line IC terminal 22, a Vcom line IC terminal 33, a data line IC terminal 23, and a Vcom line IC terminal 34. Given there are N data lines, there would be N+1 Vcom line IC terminals. This alternative configuration gives rise to waste of IC terminals and also results in reduction of aperture ratio of the pixel unites.

SUMMARY

An embodiment of the disclosed technology provides a thin film transistor (TFT) array substrate, comprising a pixel region and a peripheral region surrounding the pixel region, wherein the pixel region comprises: horizontal gate lines; longitudinal data lines defining pixel units with the horizontal gate lines; and storage capacitor electrode (Vcom) lines; and the peripheral region comprises at least one peripheral common electrode line which is electrically connected with an integrated-circuit (IC) element, and wherein the Vcom lines are connected with the peripheral common electrode line through one or more Vcom line IC terminals; if the number of the data lines is N, the number of the Vcom line IC terminals is more than 0 and less than N+1.

Another embodiment of the disclosed technology provides a method for manufacturing a thin film transistor (TFT) array substrate comprising: forming a first conductive film on a base substrate and patterning the first conductive film to form gate lines and storage capacitor electrode (Vcom) lines; forming a second conductive film on the base substrate and patterning the second conductive film to form data lines; and forming a pixel electrode thin film layer on the base substrate and patterning the pixel electrode thin film layer to form pixel electrodes, longitudinal Vcom line electric connection sections between the Vcom lines in two adjacent rows, and one or more Vcom line IC terminals; wherein if the number of the data lines is N, the number of the Vcom line IC terminals is more than 0 and less than N+1. Further, the method comprises forming at least one peripheral common electrode line in a peripheral region surrounding a pixel region comprising the gate lines, the data lines, and the Vcom lines. The peripheral common electrode line is electrically connected with the one or more Vcom line IC terminals.

Further another embodiment of the disclosed technology discloses a liquid crystal display including the above-mentioned TFT array substrate.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

The technical solutions of the embodiments of the disclosed technology will be described clearly and completely in combination with the drawings of the embodiments of the disclosed technology. Obviously, the described embodiments are a part of the embodiments of the disclosed technology, but not all the embodiments. Based on the embodiments of the disclosed technology, the other embodiments obtained by those skilled in the related art without inventive work fall within the scope of the disclosed technology.

Figure 2:
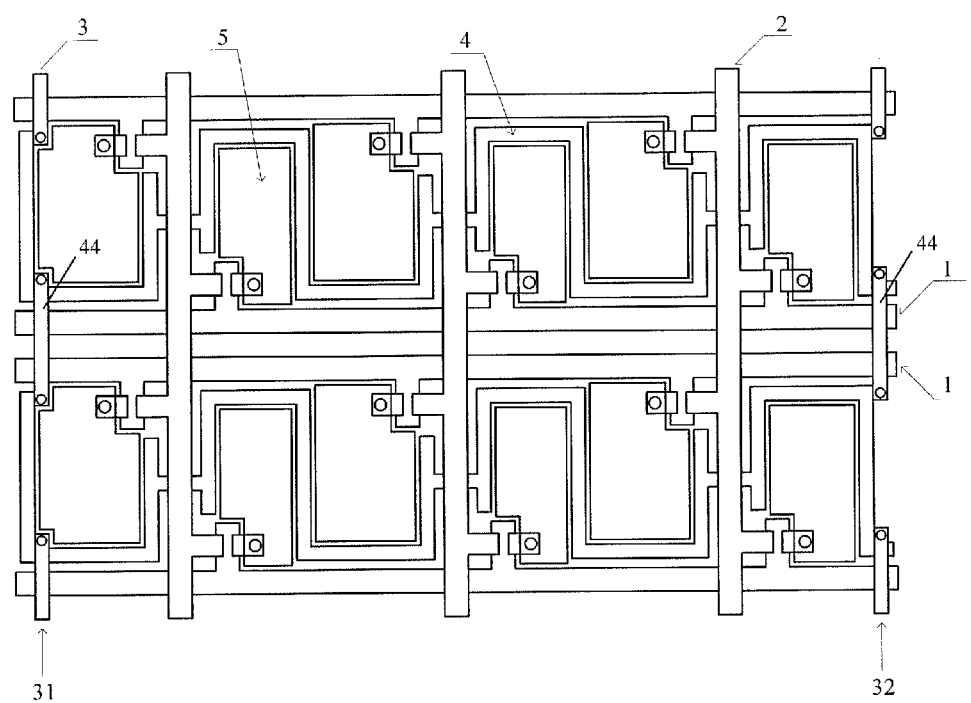
FIG. 2 shows a structural schematic view of the TFT array substrate according to an embodiment of the disclosed technology.
Figure 9A:
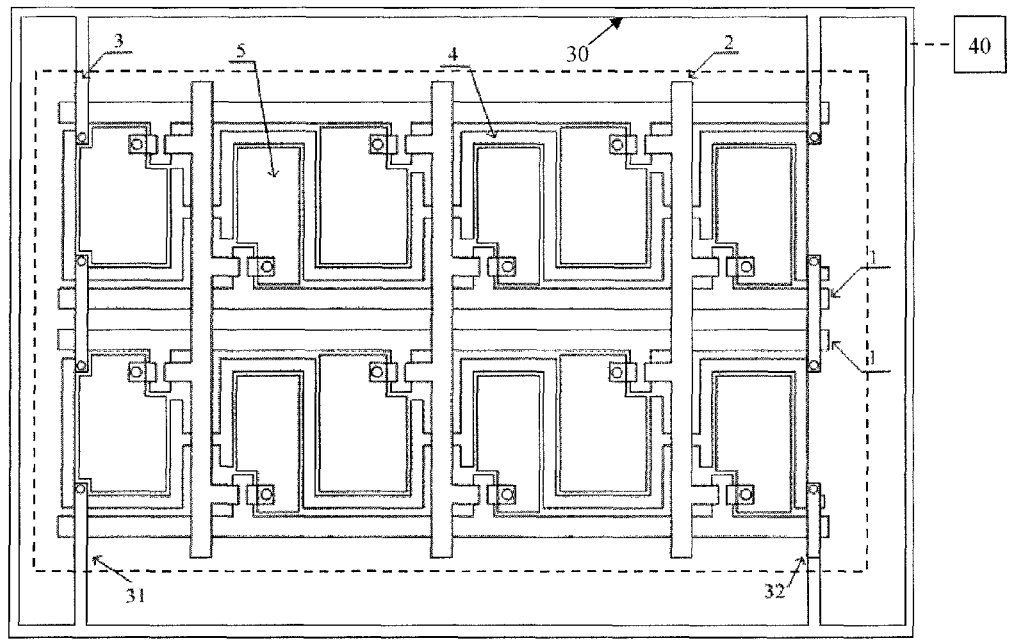
FIG. 9(a) and FIG. 9(b) each show a structural schematic view of the TFT array substrate corresponding to the embodiment as shown in FIG. 2.
Figure 9B:
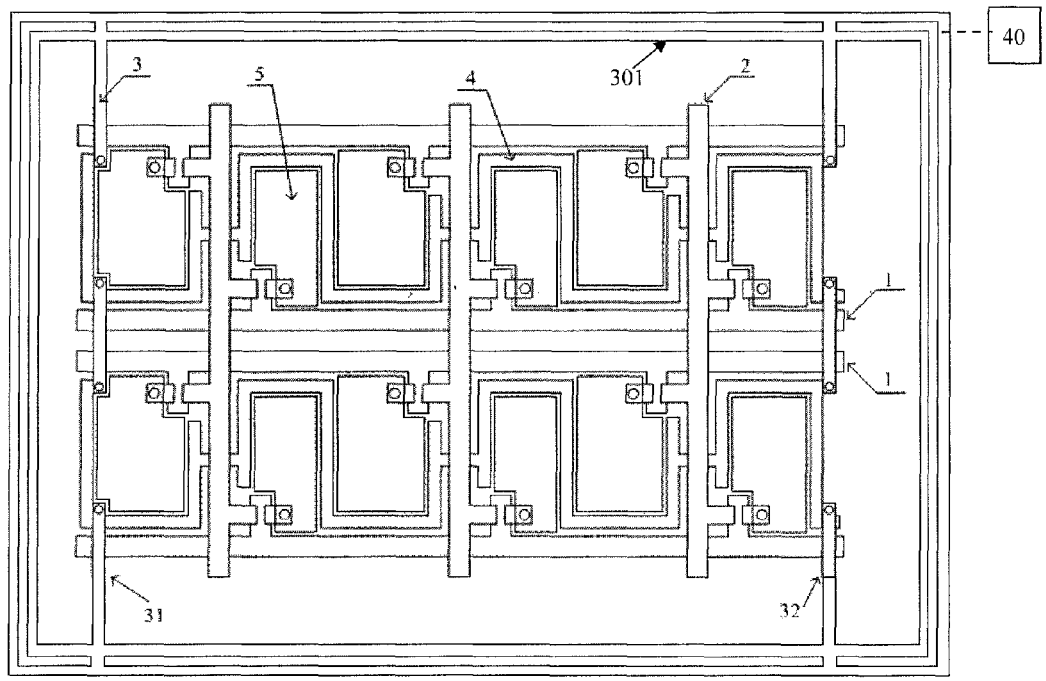
Figure 10:
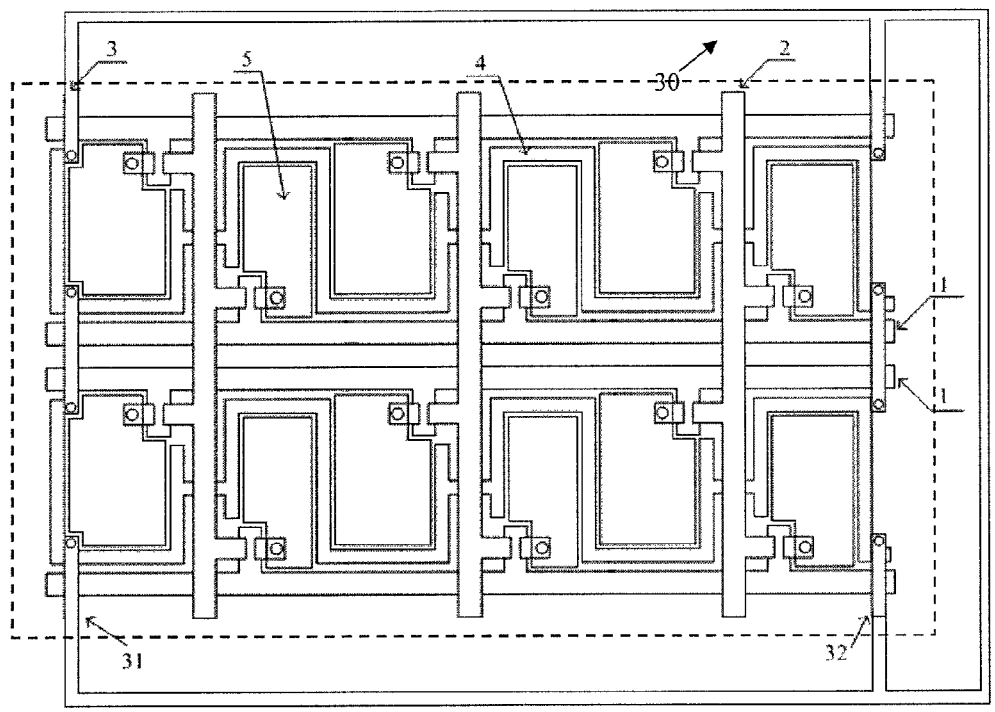
FIG. 10 shows a structural schematic view of the modification of the TFT array substrate as shown in FIG. 9(a).

As shown in FIG. 2 (also in FIG. 9(a), FIG. 9(b) or FIG. 10), an embodiment of the disclosed technology provides a dual-gate TFT array substrate, which comprises a glass substrate (not shown in the drawing), and horizontal gate lines 1, reticulated Vcom lines 4, longitudinal data lines 2, and pixel units 5 defined by the horizontal gate lines 1 and longitudinal data lines 2, which are formed on the glass substrate as a base substrate. The Vcom lines, corresponding to respective pixel units, of the reticulated Vcom line 4 in each row are connected with each other, and Vcom lines 4 are connected to the IC driver 40 through the Vcom line IC terminals 3. Within the dual-gate configuration, two gate lines as one group are provided between every two adjacent rows of pixel units.

The TFT array substrate according to an embodiment of the disclosed technology comprises a pixel region (which can be called as display region as well) and a peripheral region which surrounds the pixel region. As shown in FIG. 9(a), FIG. 9(b) and FIG. 10, the region enclosed by the dashed-line frame is the pixel region of the TFT array substrate (the region also corresponding to the showing of FIG. 2), and this region comprises the horizontal gate lines 1, the reticulated Vcom lines 4, the longitudinal data lines 2, and so on. The region outside the dashed-line frame is the peripheral region, and this region comprises at least one peripheral common electrode line 30, which is electrically connected with the IC driver 40 and the Vcom line IC terminals 3 in the pixel region. That is, the reticulated Vcom lines 4 in the pixel region are connected with the IC driver 40 through the Vcom line IC terminals 3 and the peripheral common electrode line 30. The IC driver 40 applies, for example, common electrode signals to the Vcom line IC terminals 3 and the Vcom lines 4. As shown in FIG. 9(b), in the case where the peripheral region comprises two or more than two peripheral common electrode lines 30, and these peripheral common electrode lines 30 may be parallel to and electrically connected with each other. The peripheral common electrode lines may be on a same layer, or may be on different layers (not illustrated) and overlap each other in the direction perpendicular to the array substrate, in which case the two lines are separated with an intermediate layer.

Each of the Vcom line IC terminals 3 extends longitudinally and is electrically connected with the peripheral common electrode line 30 at the upper and lower sides of the array substrate as shown in the drawings.

As shown in FIG. 9(a), in an example the peripheral common electrode line 30 is of an enclosed frame that surrounds the pixel region; as shown in FIG. 10, in another example, the peripheral common electrode line 30 is of an opened frame without an open side (left side as shown) defining the pixel region on the other three sides. The structure of the peripheral common electrode line 30 is not limited to the illustrated examples of the embodiments of the disclosed technology. The peripheral common electrode line 30 can remarkably reduce the total resistance of the common electrodes on the TFT array substrate and simplify the configuration to apply the common electrode signals as well.

If the number of the data lines 2 of the TFT array substrate according to the embodiment is N, then the number of the Vcom line IC terminals 3 in this embodiment is more than 0 and less than N+1. For example, the number of the data lines 2 is 3 (i.e., N=3), the number of the Vcom line IC terminals 3 is 2, that is, 0<2<(3+1), satisfying the requirement that the number of the Vcom line IC terminals 3 is more than 0 and less than N+1.

Figure 1:
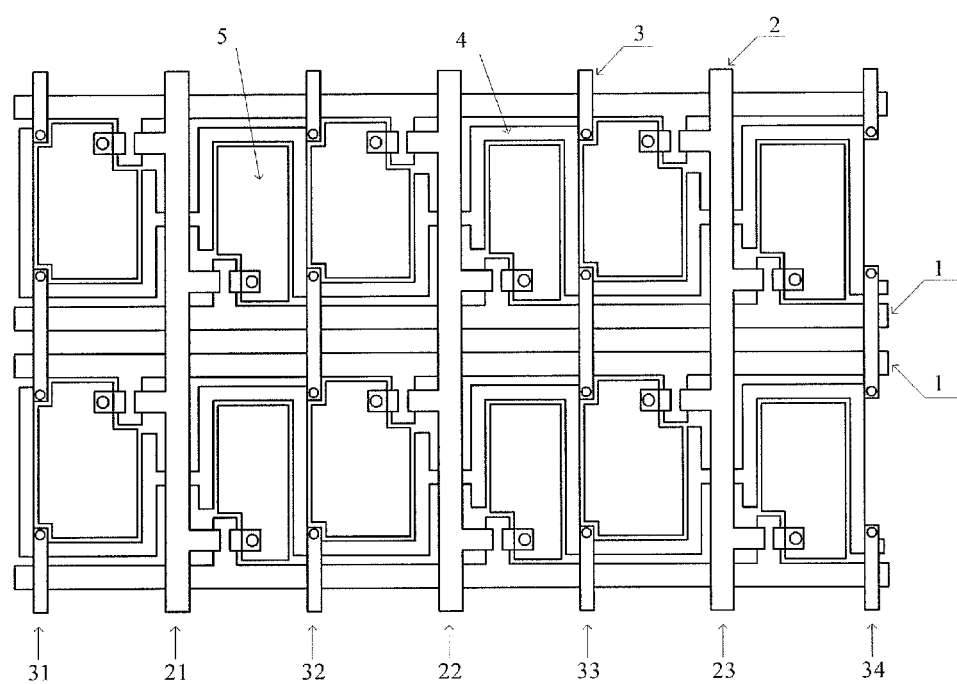
FIG. 1 shows a structural schematic view of a conventional dual-gate TFT array substrate.

For the technology as shown in FIG. 1, if the Vcom line IC terminals are arranged alternatively with the data lines, there are four (4) Vcom line IC terminals in the case where there are three (3) data lines. Therefore, it can be seen that in this embodiment of the disclosed technology only two (2) Vcom line IC terminals are needed in the same case where there are three (3) data lines. The experiments made by the inventors show that more than one Vcom line IC terminal can used to avoid the greenish defect, thus the embodiment of the disclosed technology can reduce the number of used IC terminals while avoids the greenish defect and improves aperture ratio of the relevant pixel units.

In addition, there are at least one set of longitudinal electric connection sections between the Vcom lines 4 in two adjacent rows for the Vcom lines 4. In this embodiment, as shown in FIG. 2, among the Vcom lines 4 in two adjacent rows, there is one set of longitudinal electric connection sections 44 for the Vcom lines 4 corresponding to each of the Vcom line IC terminals 3 in the longitudinal direction, i.e., the Vcom line IC terminals 31, 32. However, the disclosed technology is not limited thereto, between the Vcom lines 4 in two adjacent rows, there may be more longitudinal electric connection sections for Vcom lines in the longitudinal direction than the Vcom line IC terminals 3.

In the dual-gate TFT array substrate provided in the embodiment of the disclosed technology, where N data lines are provided, the number of the Vcom line IC terminals is more than 0 and less than N+1, and there are at least one set of longitudinal electric connection section for Vcom line between the Vcom lines in two adjacent rows. In this way, the number of the Vcom line IC terminals on the TFT array substrate can be reduced, and accordingly the costs for manufacturing the TFT array substrate is lowered, and the aperture ratio of the pixel units in which no Vcom line IC terminals and no Vcom line longitudinal electric connection sections are provided can be increased. In addition, because the number of the Vcom line IC terminals is still more than 0, the greenish defect can be avoided as well.

Figure 3:
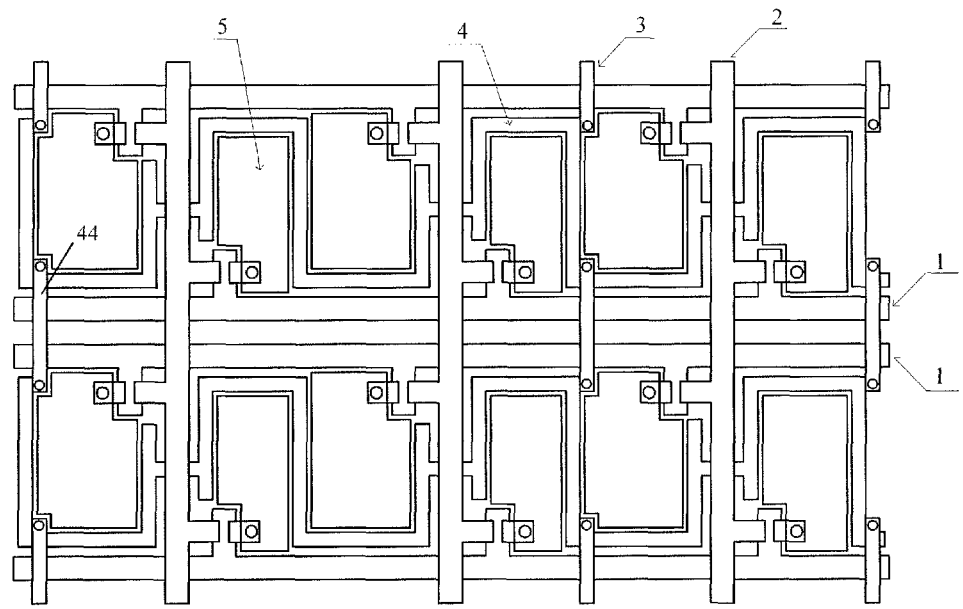
FIG. 3 shows a structural schematic view of the TFT array substrate according to another embodiment of the disclosed technology.
Figure 4:
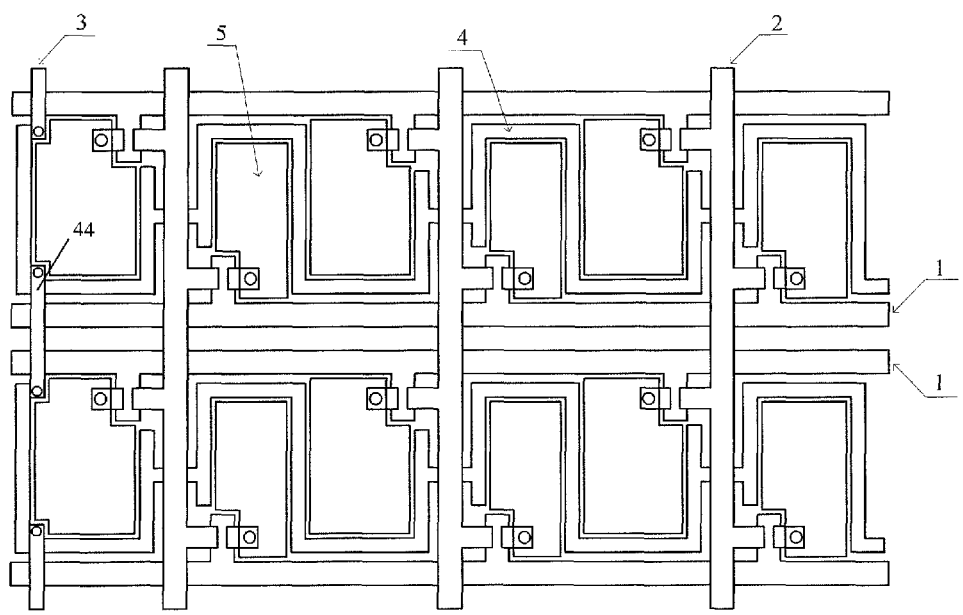
FIG. 4 shows a structural schematic view of the TFT array substrate according to still another embodiment of the disclosed technology.

Of course, the two extreme cases include: compared with the conventional alternative arrangement of the Vcom line IC terminals and the data lines, the embodiment of the disclosed technology reduces the number of the Vcom line IC terminals by one only (as shown in FIG. 3), and reduces the number of the Vcom line IC terminals to only one (as shown in FIG. 4). In other words, compared with the conventional alternative arrangement, the embodiment of the disclosed technology can reduce the number of the Vcom line IC terminals from that reduced by one only to only one Vcom line IC terminal in theory.

When the number of the Vcom line IC terminals is reduced by one only, as shown in FIG. 3, if there are two (2) data lines 2, the number of the Vcom line IC terminals 3 is 3, 0<3<(3+1), which satisfies the requirement that the number of the Vcom line IC terminals 3 is more than 0 and less than N+1; meanwhile, when the number of the Vcom line IC terminals is reduced to only one, as shown in FIG. 4, if there are three (3) data lines 2, the number of the Vcom line IC terminals 3 is 1, 0<1<(3+1), which satisfies the requirement that the number of the Vcom line IC terminals 3 is more than 0 and less than N+1.

In FIG. 3 and FIG. 4, between the Vcom lines 4 in two adjacent rows, there are sets of Vcom line longitudinal electric connection sections 44 respectively corresponding to the Vcom line IC terminals 3 in the longitudinal direction. That is, in FIG. 3, there are three (3) corresponding sets of longitudinal electric connection sections for the Vcom lines 4; in FIG. 4, there is one (1) corresponding set of longitudinal electric connection section for the Vcom lines 4.

The configuration of the Vcom lines 4 are not limited to be in the above illustrated reticulated configuration, and for example it comprise only longitudinal portions, which correspond to the Vcom line IC terminals 3 respectively in one example. In another example, the horizontal portions of the Vcom lines 4 are electrically connected through only one longitudinal portion, and this longitudinal portion corresponds to only one Vcom IC terminal 3.

An embodiment of the disclosed technology provides a method for manufacturing a dual-gate TFT array substrate, which comprises the following steps.

S501, forming a first conductive film on a base substrate and patterning the first conductive film with a patterning process to form gate lines and Vcom lines; the Vcom lines corresponding to the pixel units in each row are connected with each other.

Figure 5:
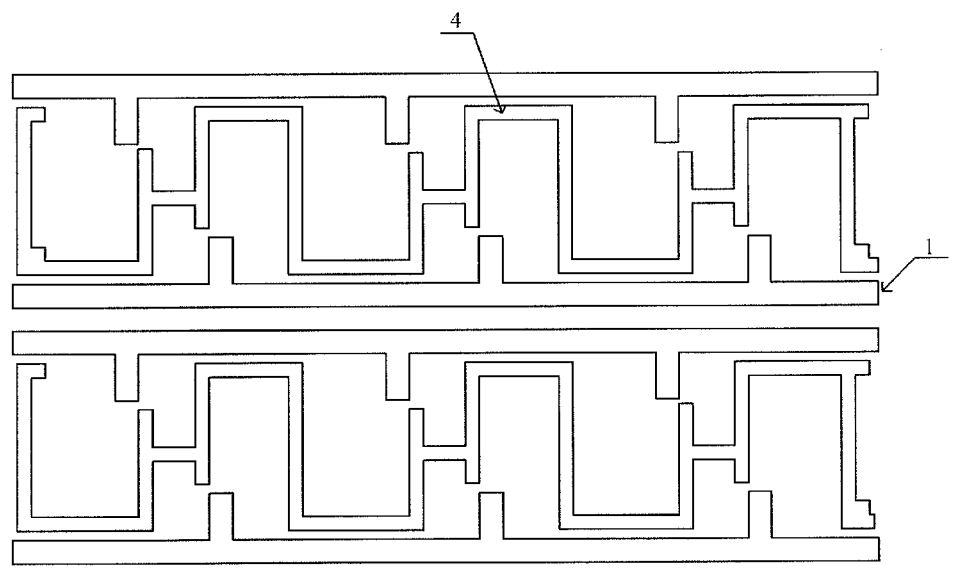
FIG. 5 shows a first schematic view of the method for manufacturing a TFT array substrate according to an embodiment of the disclosed technology.

In an example, with a magnetron sputtering method, a metal thin film with a thickness of 1000 Å through 7000 Å is formed on a base substrate such as a glass substrate. The material of the metal thin film may be molybdenum, aluminum, aluminum nickel alloy, molybdenum tungsten alloy, chromium, copper or the like, and may be a multiple-layer structure formed with the one or more of the above-described metal materials. Then, the metal thin film is patterned with a patterning process with a mask plate, comprising exposing, developing, etching, photoresist removing, and so on, as shown in FIG. 5, to form gate lines 1 and Vcom lines 4 running in the horizontal direction in certain regions on the glass substrate; gate electrodes of the TFTs are connected with the gate lines, and Vcom lines 4 corresponding to the pixel units (i.e., in each of the pixel units) in each row are connected with each other.

S502, forming a gate insulation layer on the gate lines, then forming an active layer on the gate insulation layer corresponding to gate electrodes connected with the gate lines.

In an example, a gate insulation layer of a thickness of 1000 Å to 6000 Å and an amorphous silicon thin film of a thickness of 1000 Å to 6000 Å can be sequentially faulted with a chemical vapor deposition (CVD) method on the glass substrate. The material of the gate insulation layer may be silicon nitride, silicon oxide, or silicon oxynitride. A photoresist etching pattern is obtained with a mask plate for exposing, then the amorphous silicon thin film is subject to a dry etching process, an active layer in an island structure or a peninsula structure can be formed on each gate electrode.

S503, forming a second conductive film on the base substrate and patterning the second conductive film with a patterning process to form data lines.

Figure 6:
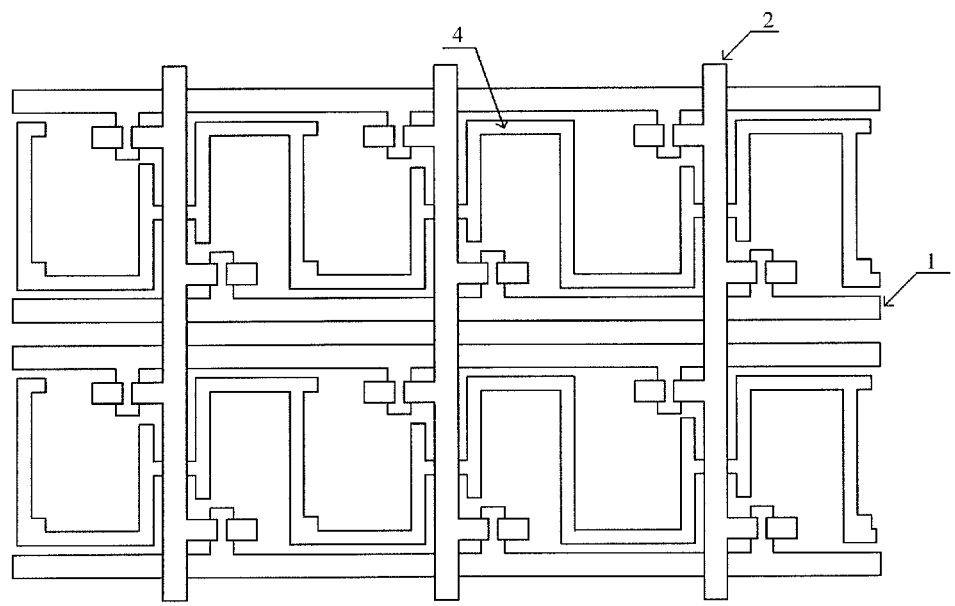
FIG. 6 shows a second schematic view of the method for manufacturing a TFT array substrate according to the embodiment of the disclosed technology.

In an example, with a similar process to that for forming the gate lines, a metal thin film with a thickness of 1000 Å to 7000 Å is formed on the glass substrate, the material of which is similar to that for gate lines. As shown in FIG. 6, the metal thin film is patterned by a patterning process with a mask plate to form data lines 2 and source electrodes and drain electrodes of thin film transistors (TFTs), and channels of the active layers are defined between the source electrodes and the drain electrodes, thus the source electrodes, the drain electrodes, the active layers and the previously formed gate electrodes together constitute TFTs.

S504, forming a transparent passivation layer on the data lines and forming via holes at the positions over the drain electrodes and the Vcom lines.

Figure 7:
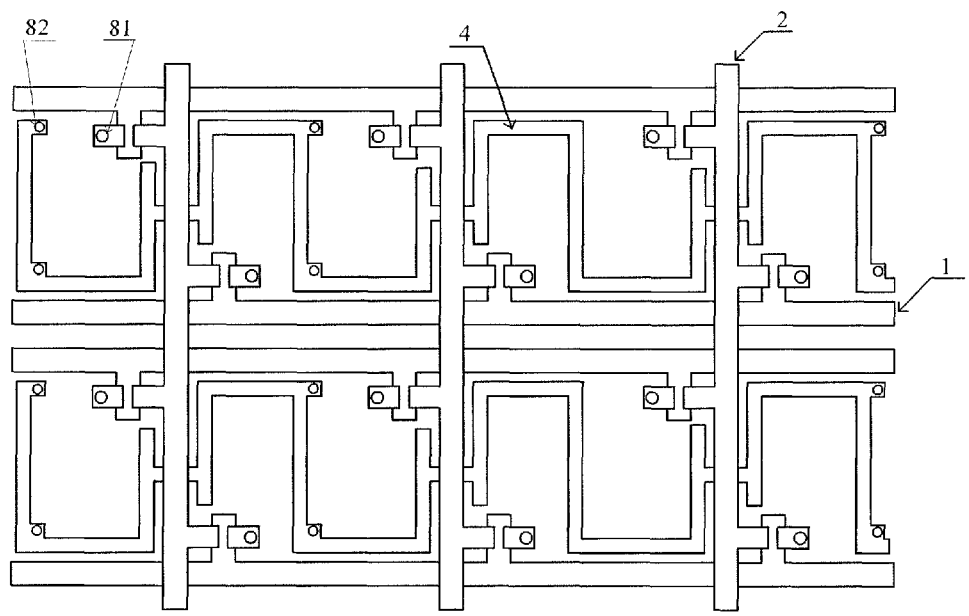
FIG. 7 shows a third schematic view of the method for manufacturing a TFT array substrate according to the embodiment of the disclosed technology.

In an example, with a similar process to that for forming the gate insulation layer or the active layer, a passivation layer with a thickness of 1000 Å to 6000 Å is formed (e.g., coated) over the entire glass substrate, the material of which may be silicon nitride or a transparent organic resin material. Here, the gate lines and the data lines are overcoated with the passivation layer of the same thickness. As shown in FIG. 7, the passivation layer is patterned with a patterning process, and connecting via holes 81, 82 are formed at the positions corresponding to the drain electrodes and the Vcom lines.

S505, forming a pixel electrode thin film layer on the transparent passivation layer.

In an example, a pixel electrode thin film layer is deposited on the passivation layer over the entire glass substrate. The material of the pixel electrode thin film layer may be ITO (Indium Tin Oxide) or IZO (Indium Zinc Oxide) and of a thickness of 100 Å to 1000 Å.

Figure 8:
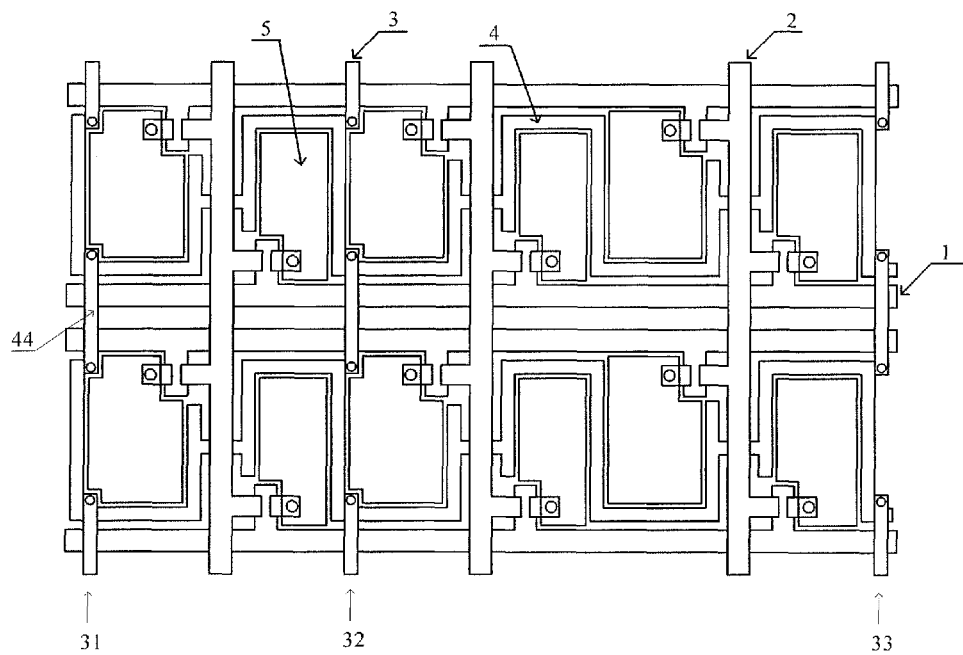
FIG. 8 shows a fourth schematic view of the method for manufacturing a TFT array substrate according to the embodiment of the disclosed technology.

S506, patterning the pixel electrode thin film layer on the base substrate with a patterning process to form pixel electrodes 5 of the pixel units, longitudinal electric connection sections 44 between the Vcom lines 4 in two adjacent rows, and Vcom line IC terminals 3 in the pixel region, as shown in FIG. 8, and the peripheral common electrode line(s) in the peripheral region with reference FIG. 9(a) or FIG. 9(b). The Vcom line IC terminal or terminals 3 in the pixel region are connected with the peripheral common electrode line(s) in the peripheral region. If the number of the data lines 2 is N, the number of the Vcom line IC terminals 3 is more than 0 and less than N+1, and there is at least one Vcom line longitudinal electric connection section 44 between the Vcom lines 4 in two adjacent rows, thus the Vcom lines 4 are reticulated, that is, form a network configuration, on the base substrate.

In the above exemplary method, the peripheral common electrode line in the peripheral region is formed along with the Vcom line IC terminal(s) 3 in the pixel region.

In another embodiment of the disclosed technology, in step S501, the peripheral common electrode line in the peripheral region is formed along with the Vcom lines 4; in step S504, via holes are formed at the positions over the peripheral common electrode line as well; in step S506, the Vcom line IC terminal or terminals 3 are formed and electrically connect the Vcom lines 4 in the pixel region and the peripheral common electrode line in the peripheral region through the via holes corresponding to the Vcom lines 4 and the via holes corresponding to the peripheral common electrode line.

In further another embodiment of the disclosed technology, peripheral common electrode lines (e.g., a first peripheral common electrode line and a second peripheral common electrode line) are formed respectively in step S501 and step S506, and the first peripheral common electrode line and the second peripheral common electrode line may be electrically connected with each other through via holes provided in the passivation layer and corresponding to the peripheral common electrode lines, and may overlap with each other in the direction perpendicular to the array substrate; and one of the first and second peripheral common electrode lines may be electrically connected with the Vcom line IC terminal(s) 3.

In this embodiment, as shown in FIG. 2, between the Vcom lines 4 in two adjacent rows, there is one set of Vcom line longitudinal electric connection sections 44 corresponding to each Vcom line IC terminal 3 in the longitudinal direction, i.e., there are two sets of Vcom line longitudinal electric connection section respectively corresponding to the Vcom line IC terminals 31, 32; however the disclosed technology is not limited thereto, between the Vcom lines 4 in two adjacent rows the number of the sets of longitudinal electric connection sections 44 may be more than that of the Vcom line IC terminals 3.

In the TFT array substrate obtained by the method for manufacturing the dual-gate TFT array substrate according to the embodiment of the disclosed technology, when the number of the data lines is N, the number of the Vcom line IC terminals is more than 0 and less than N+1; furthermore, there is at least one corresponding set of Vcom line longitudinal electric connection section between the Vcom lines in two adjacent rows. The number of the Vcom line IC terminals on the TFT array substrate can be reduced, and accordingly the costs for manufacturing the TFT array substrate can be lowered, and the aperture ratio of the pixel units where no Vcom line IC terminals and no Vcom line longitudinal electric connection sections are provided can be increased. In addition, because the number of the Vcom line IC terminals is still more than 0, the greenish defect can be avoided as well.

Of course, the two extreme cases are: compared with the conventional alternative arrangement of the Vcom line IC terminals and the data lines, the embodiment of the disclosed technology reduces the number of the Vcom line IC terminals by one only (as shown in FIG. 3 omitting the peripheral common electrode line for simplicity), and reduces the number of the Vcom line IC terminals to only one (as shown in FIG. 4 omitting the peripheral common electrode line for simplicity). In other words, compared with the conventional alternative arrangement, the embodiment of the disclosed technology can reduce the number of the Vcom line IC terminals from that reduced by one only to only one Vcom line IC terminal in theory.

In the above description, a dual-gate TFT array substrate is taken for example; however those skilled in the art should understand that the scope of the disclosed technology is not limited thereto, and the embodiment of the disclosed technology can also be applied to other types of TFT array substrates which comprise Vcom lines, for example, only one gate line is provided between two adjacent rows of pixel units.

According to another embodiment of the disclosed technology, there is further provided a liquid display device, comprising a TFT array substrate in any of the above embodiments and an opposing substrate. In the liquid crystal display, the TFT array substrate and the opposed substrate are disposed opposite to each other so as to form a liquid crystal cell, and a liquid crystal material is filled in the liquid crystal cell. The opposed substrate is, for example, a color filter substrate. A pixel electrode in each pixel unit of the TFT array substrate acts to apply an electric field for controlling the rotation degree of the liquid crystal material, so as to conduct a display operation. In some examples, the liquid crystal display device further comprises a backlight source used to provide backlight for the array substrate.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. A thin film transistor (TFT) array substrate, comprising a pixel region and a peripheral region surrounding the pixel region, wherein the pixel region comprises:
   horizontal gate lines;
   longitudinal data lines defining pixel units with the horizontal gate lines; and
   storage capacitor electrode (Vcom) lines that extend horizontally; and
   the peripheral region comprises two peripheral common electrode lines which are electrically connected with an integrated-circuit (IC) element, and each of the two peripheral common electrode lines is of an enclosed frame surrounding the pixel region, and
   wherein each of two Vcom lines that are outmost and closest to the peripheral common electrode line are each directly connected with the peripheral common electrode line through Vcom line IC terminals, and the two Vcom lines that are outmost and closest to the peripheral common electrode line are directly connected with the peripheral common electrode line through different Vcom line IC terminals;
   the two peripheral common electrode lines are parallel to each other and electrically connected with each other, and one of the two peripheral common electrode lines is connected with the Vcom lines; and
   wherein the two peripheral common electrode lines are provided in a same layer.

2. The TFT array substrate according to claim 1, wherein two gate lines as one group are provided between every two adjacent rows of pixel units.

3. The TFT array substrate according to claim 1, wherein the two peripheral common electrode lines are provided on different layers.

4. The TFT array substrate according to claim 3, wherein the two peripheral common electrode lines overlap with each other in a direction perpendicular to the array substrate.

5. The TFT array substrate according to claim 1, wherein the Vcom lines are in a reticulated configuration.

6. The TFT array substrate according to claim 5, wherein the Vcom lines corresponding to the pixel units in each row are connected with each other.

7. The TFT array substrate according to claim 5, wherein at least one Vcom line longitudinal electric connection section is provided between the Vcom lines in two adjacent rows.

8. The TFT array substrate according to claim 7, wherein one set of Vcom line longitudinal electric connection sections each between Vcom lines in two adjacent rows are provided corresponding to one of the Vcom line IC terminals in the longitudinal direction.

9. The TFT array substrate according to claim 6, wherein at least one Vcom line longitudinal electric connection section is provided between the Vcom lines in two adjacent rows.

10. The TFT array substrate according to claim 9, wherein one set of Vcom line longitudinal electric connection sections each between Vcom lines in two adjacent rows are provided corresponding to one of the Vcom line IC terminals in the longitudinal direction.

11. A liquid crystal display comprising thin film transistor (TFT) array substrate according to claim 1.

12. The liquid crystal display according to claim 11, wherein the array substrate is of a dual-gate configuration.

* * * * *